(12) United States Patent
Young et al.

(10) Patent No.: US 6,814,583 B1
(45) Date of Patent: Nov. 9, 2004

(54) THROUGH-BOARD PCB EDGE CONNECTOR, SYSTEM AND METHOD

(75) Inventors: J. Pat Young, Laguna Niguel, CA (US); Michael C. Kelley, Sunnyvale, CA (US); Joungho Kim, Daejon (KR)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

(21) Appl. No.: 10/244,152

(22) Filed: Sep. 12, 2002

(51) Int. Cl.$^7$ .............................................. H01R 12/00
(52) U.S. Cl. ................................... 439/65; 439/62
(58) Field of Search .......................... 439/65, 62, 247, 439/248, 701

(56) References Cited

U.S. PATENT DOCUMENTS

| | | | |
|---|---|---|---|
| 5,514,000 A | | 5/1996 | Krause et al. |
| 5,820,388 A | * | 10/1998 | Walden ........................ 439/62 |
| 6,012,927 A | * | 1/2000 | Longueville et al. ......... 439/65 |
| 6,030,242 A | | 2/2000 | Cunningham et al. |
| 6,052,278 A | | 4/2000 | Tanzer et al. |
| 6,077,130 A | * | 6/2000 | Hughes et al. .............. 439/862 |
| 6,089,904 A | * | 7/2000 | Wu ............................. 439/495 |
| 6,152,742 A | * | 11/2000 | Cohen et al. ................. 439/60 |
| 6,347,950 B1 | * | 2/2002 | Yokoyama et al. ......... 439/248 |
| 6,453,550 B1 | * | 9/2002 | Farnworth et al. ............ 29/842 |
| 6,494,749 B1 | | 12/2002 | Chang |

* cited by examiner

*Primary Examiner*—Gary Paumen
(74) *Attorney, Agent, or Firm*—Perkins Coie LLP (57) ABSTRACT

A female edge connector is cut into a circuit board to reduce the connector size and therefore the distance the signal path is separated from the ground plane. Preferably, the female connector is a surface mount connector and is provided in two pieces. This allows the female connector to be attached to either side of the printed circuit board or can be connected to both sides if half of the connector is mounted on the opposite side of the board from the other. A male edge connector of a plug-in board can then be inserted through the aperture formed in the mother board to contact the female edge connector, providing very little distance between the ground planes of the plug-in board and the mother board. The distance between the two pieces of the female connector can be varied by changing the width of the aperture such that PC boards of various thicknesses can be accommodated.

25 Claims, 12 Drawing Sheets

THROUGH-BOARD PCB EDGE CONNECTOR, SYSTEM AND METHOD

BACKGROUND OF THE INVENTION

This invention relates generally to printed circuit board (PCB) connectors, and more particularly to high performance PCB edge connectors, systems and methods.

The use of electronics has become ubiquitous, finding its way into all manners and shapes of devices and appliances ranging from toasters to super-computers. Most electronic circuitry is now implemented with their active and passive devices coupled together by a printed circuit board (PCB). This is true whether the electronic circuitry being implemented is primarily analog in nature, digital in nature, or a hybrid of the two.

In its simplest form, a PCB is a relatively thin sheet of a dielectric (i.e. electrically non-conductive) material such as a resin-filled fiberglass. Metal lines or "traces" are typically formed on one or more surfaces of the fiberglass to provide electrical connections between the various components of the electronic circuit.

Printed circuit boards can be "one sided," in which all of the traces are formed on one side of the dielectric sheet of material. PCBs can also be "two sided," where traces are formed on both sides of the sheet of dielectric material. Furthermore, PCBs can be "multi-layer" where multiple dielectric layers are sandwiched between conductive layers, which may form traces or which may form grounds and/or power planes. With multi-layer boards it is common to provide electrical connections between various layers by the formation of "vias" (conductive plugs between metal layers) or through-holes through which conductors can be threaded.

Commonly, an electronic circuit implemented on a PCB is connected to other devices. These may be input/output devices, other electronic circuits supported on other PCBs, transmission lines, etc. While such devices could be connected directly to the PCB (such as being soldered to some of its traces or bonding pads), most commonly the connection to external devices or circuits is through a removable connector assembly. Electrical connectors of various types have been developed through the years for just this purpose.

Figure 1:
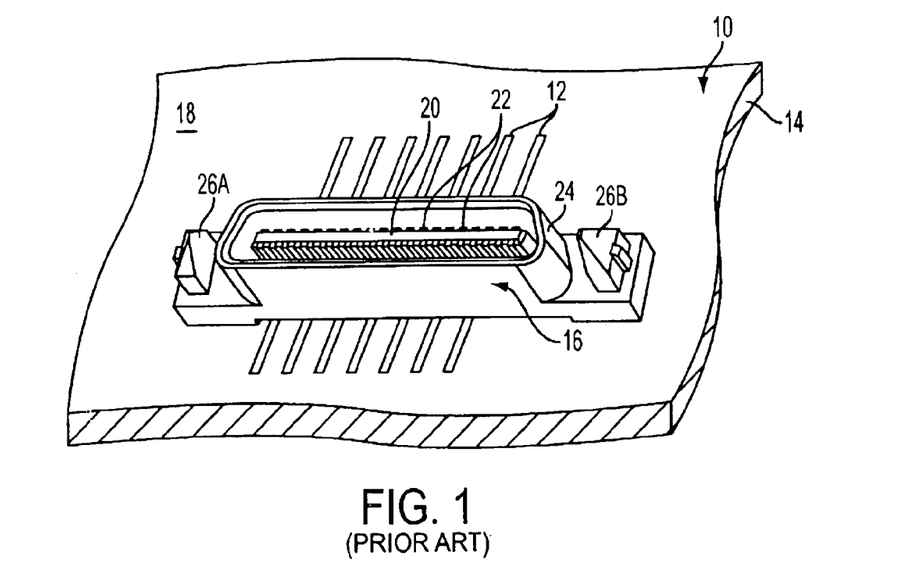
FIGS. 1 and 2 illustrate the male and female portions, respectively, of a prior art SCA connector.
Figure 2:
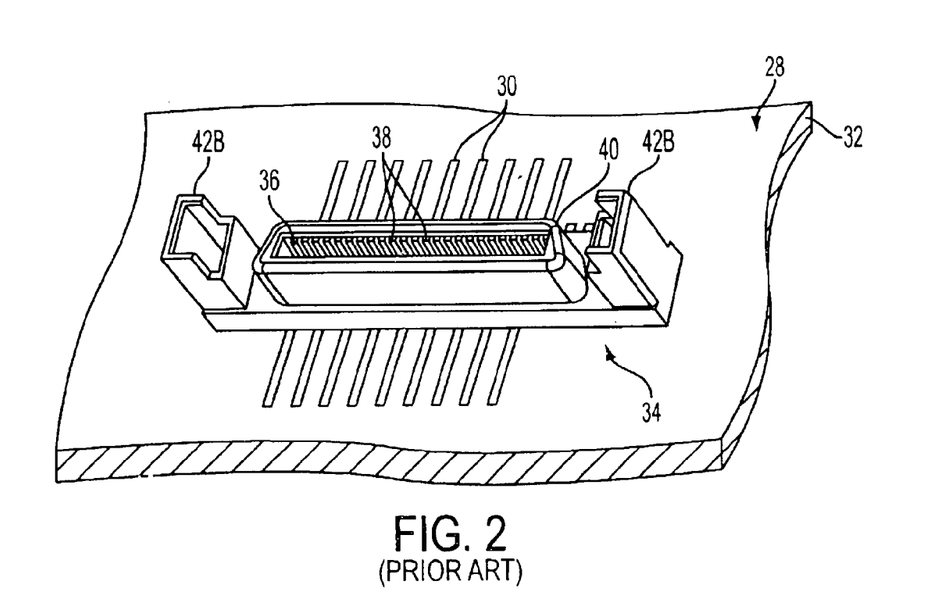

FIGS. 1 and 2 illustrate a connection system of the prior art. This particular connection system is known as a single connector attachment or "SCA" and was primarily designed to replace the older Small Computer System Interface or "SCSI" connector design, which was not designed for modern high-frequency digital circuit operation.

In FIG. 1, a PCB 10 including traces, 12 formed on a dielectric body 14 has a male SCA connector 16 attached to its upper surface 18. The male connector 16 includes a support 20 having a number of electrical contacts 22 and a surrounding shroud 24. The SCA male connector 16 is also provided with a pair of alignment posts 26a and 26b.

In FIG. 2, a PCB 28 provided with traces 30 on a dielectric substrate 32 includes a female SCA connector 34. The female connector includes a slot 36 provided with a plurality of contacts 38. The slot 36 is receptive to the support 20 such that when the support 20 engages with the slot 36 the contacts 22 of the male connector 16 engage with the contacts 38 of the female connector 34. The shroud 24 of the male connector 16 surrounds the body 40 of the female connector 34. The male connector 16 is guided into and locked in place with the female connector 34 by the alignment post 26a and 26b aligning with and engaging the alignment columns 42a and 42b of the female connector 34.

The contacts 22 are in electrical contact with some of the traces 12 of the printed circuit board 10. This can be accomplished with a surface mount technology (SMT) if the traces are formed on the same side of the printed circuit board as the male connector 16, or with pin-through technology if the traces 12 are formed on the opposite side of the PCB 10 from the connector 16. In the present example, a surface mount technology is illustrated. Likewise, the electrical contacts 38 connect to certain ones of the traces 30 at printed circuit board 28. Thus, when the male connector 16 is engaged with the female connector 34, the printed circuit boards 10 and 28 are in electrical communication.

It should be noted that while the SCA connectors are shown to be attached to two different PCB boards, one of the SCA connectors, such as the male SCA connector 16, could, instead, be coupled to a cable, such as a ribbon cable. In this fashion, the SCA connector can be used to couple physically separated electronic devices.

Two-piece connectors such as the SCA connectors illustrated in FIGS. 1 and 2 have several advantages. For one, they are mechanically guided and secured which aids in the engagement and the retention of the engagement of the connector system. For another, since they are typically made from metal, they are well-shielded by, for example, the body of their connectors and by the shroud 24 of the male connector. This helps reduce electromagnetic radiation and, therefore, electromagnetic interference (EMI). However, these connectors suffer from a number of drawbacks including cost, size, and an impedance matching problems generated by the wide separation between the ground planes of the two electronic circuits being coupled together caused by the connectors.

Figure 3:
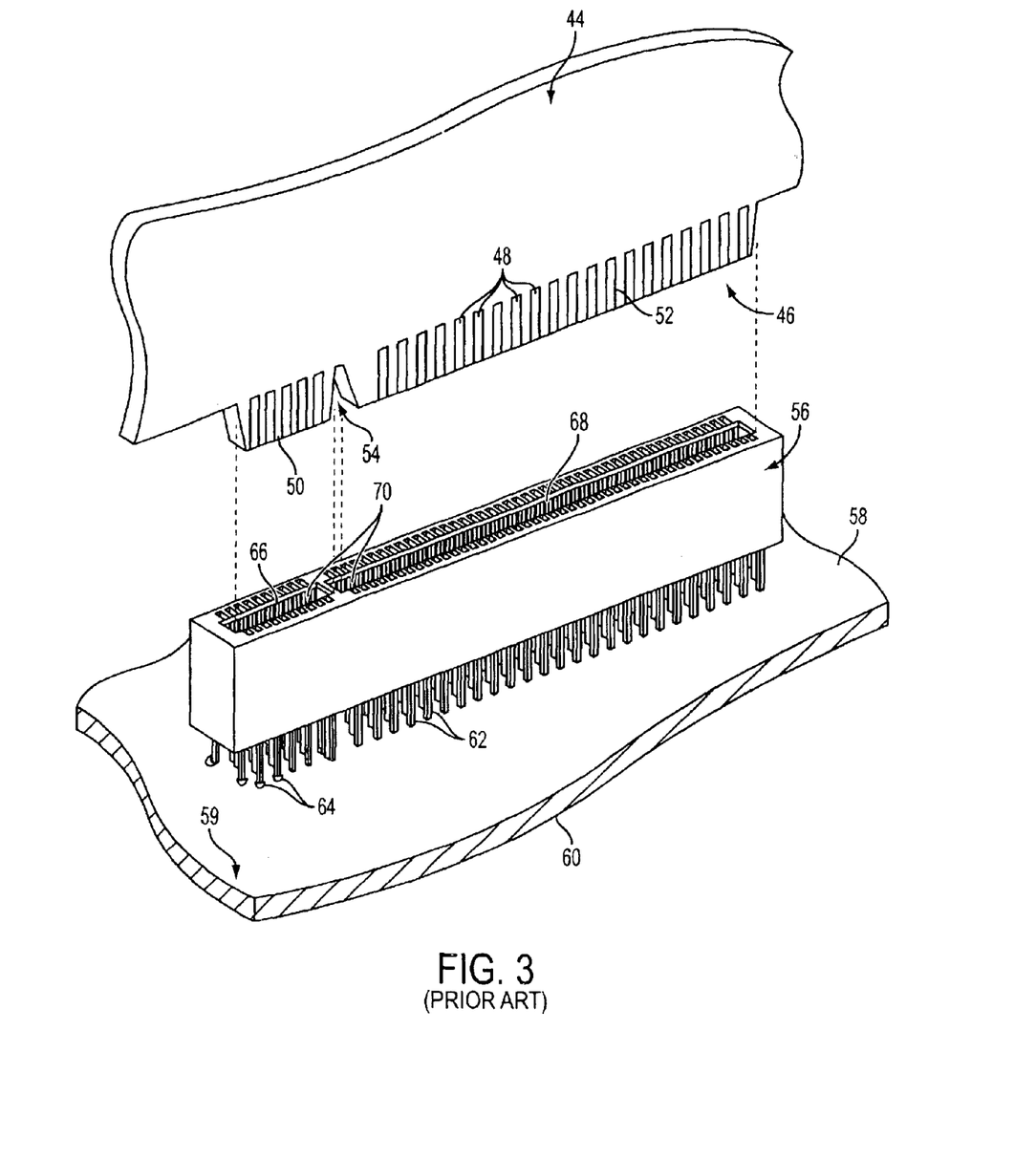
FIG. 3 is a perspective view illustrating a plug-in card edge connector system of the prior art.

Another connection technology of the prior art is illustrated in FIG. 3. In this figure, a first PCB or "plug-in board" 44 includes a male edge connector portion 46. This edge connector 46 is simply a portion of the PCB with a number of traces 48 that serve as contacts with contacts of a female edge connector. In this particular illustrated example, the edge connector has a first portion 50 and a second portion 52 separated by a slot 54. There are also unslotted variants of edge connectors in the prior art.

The female edge connector 56 is preferably coupled to a PCB 58 having traces on its bottom surface 60 (not shown), traces can also be located on a top surface 59 of PCB 58. Pins 62 of the female edge connector 56 extend through holes 64 drilled through the printed circuit board 58 and are soldered to traces or bonding pads at the end of traces on the bottom surface 60. The female edge connector 56 is provided with a pair of slots 66 and 68 including a number of contacts 70 which couple to the pins 62.

In operation, the first portion 50 of the male edge connector 46 engages the slot 66 of the female edge connector 56, and the second portion 52 of the male edge connector 46 engages with the slot 68 of female edge connector 56. In this way, the traces 48 of plug-in board 44 are in electrical contact with the contacts 70 and, therefore, the traces (not shown) of PCB 58.

The edge connector technology illustrated in FIG. 3 has certain advantages, including the elimination of a separate male connector. This not only reduces cost, but it also brings the ground planes of the two PCBs closer together, which can be advantageous, particularly in high frequency applications. However, the ground planes are still separated by the body of the female edge connector 56, thus reducing high-frequency performance.

An ever-increasing percentage of electronic circuitry is at least partially digital in nature. Furthermore, digital circuitry is operating at ever higher frequencies. For example, at the dawn of the computer age electronic circuitry was operating in the megahertz frequency range, while now it is not uncommon for circuitry to operate in the gigahertz and above frequency range. The operation of electronic circuitry at high frequencies creates a whole host of problems including EMI, cross coupling, data integrity, losses, reflections, etc.

One way of addressing the special needs of high frequency electronic circuit operation is the use of differential pairs to carry high frequency digital data. Differential pairs are typically labeled plus (+) or minus (−) where the plus line is used to carry the charge comprising the signal to the intended destination, and the minus line is used to carry the return charge. If two devices are communicating back and forth with each other, there may be a transmit differential pair and a receive differential pair to handle the two-way dialog.

The advantage of the differential pair is that the flux in the return line tends to cancel the flux in the transmission line. This reduces cross-coupling and radiation losses and, therefore, EMI as well. Differential routing is therefore a very desirable technique for use with digital electronic circuitry operating at high frequencies.

Routing high-speed differential signals on a circuit board can be accomplished by two philosophies; tightly coupled differential routing, or loosely coupled differential routing. Tightly coupled routing relies on the direct flux coupling between the differential pairs by placing the traces close enough to each other to achieve the desired differential impedance. The main drawback to this approach is that the slightest variation in trace spacing will cause a dramatic change in the differential impedance. This problem is unavoidable when the distance between the differential pairs must be altered to connect to an I.C. or connector.

Loosely coupled differential trace geometry places the differential signals much closer to the ground plane then the traces are to each other. This trace geometry relies on the ground plane as the main flux coupling media, and therefore is much less susceptible to trace spacing variation to control the impedance. Thus, in general, the use of loosely coupled differential traces are preferable over tightly coupled differential traces. The problem that occurs when using loosely coupled differential trace geometry is that when a differential pair passes through a connector system the ground plane is interrupted causing a significant impedance discontinuity. The problem of maintaining the flux coupling between a loosely coupled differential pair through any connector system is the main drawback to loosely coupled trace geometry.

The problem of impedance discontinuity through a loosely coupled differential connector system can be minimized through one of two methods: 1) create an artificial ground plane within the connector body; or 2) reduce the size of the uncoupled signal length to an extremely small distance to minimize the physical size, and therefore the magnitude, of the discontinuity. The first method, the artificial ground plane, has numerous previous implementations, most of which perform poorly or are very expensive. One example of this first method is the MICTOR (matched impedance connector) product of the TYCO company of Exeter, N.H. The second method has no known prior art because of the recent development of high-speed differential interfaces, and the recent understanding of the advantages of loosely coupled differential geometry. The problem with existing technology for physically small connector interfaces is either the designs are not robust enough for a hot swap environment, or they are designed for single ended signals and therefore have poor differential impedance control.

One company to address to this problem is the Molex Company of Lysle, Ill. The Molex connector, which can be purchased under the trademark betaphase or under the product name NextStep, includes a capton or flexible strip made in two layers with a ground plane underneath and connectors on top. The betaphase connector therefore carries the ground plane through the connector, reducing impedance matching problems. However the betaphase connector is extremely expensive, and would only be considered for the most critical of applications where cost was not considered to be a factor.

What the prior art does not address is a simple, inexpensive edge connector system for connecting a plug-in board to a mother board while maintaining the ground plane of the plug-in board in very close proximity to the ground plane of the mother board. The prior art has also not provided a female edge connector which can be configured to accommodate different thicknesses of plug-in board male edge connectors.

SUMMARY OF THE INVENTION

The present invention addresses the problems inherent in prior art solutions with a variation on a card edge connector system which reduce the physical size, and therefore the magnitude, of the discontinuity. Reducing the distance of the signal path that is not directly over a ground plane is a primary goal of the present invention.

In the present invention, a female edge connector is cut into the circuit board to reduce the connector size and therefore the distance the signal path is separated from the ground plane. Preferably, the female connector is provided in two pieces. This is done, in part, so that the surface mount connector that can be attached to either side of the PCB or can even connect to both sides if one half the connector is mounted on the opposite side of the board from the other. This feature advantageously allows one controller (or other electronic circuit) to be routed on one side of the back plane, and a second controller (or other electronic circuit) can be routed on the other. For example, a disk interface can be made to connect to both sides of the back plane so it can connect to both controllers for redundancy (in this context, redundancy refers to a situation wherein if one controller fails, the disk interface is still connected to the other controller and therefore remains functional). Advantageously, the connector system of the present invention is preferably implemented with surface mount technology and with no vias or crossed traces on the printed circuit board to degrade performance.

A through-board PCB connector in accordance with the present invention includes an elongated body made from an electrically insulating material and a plurality of space contacts each made from an electrically conducting material. The elongated body has a first end, a second end, a top, a bottom, and inner side, and an outer side, and is preferably provided with a PC board alignment nub. Each of the contacts preferably includes a spring contact portion provided at the inner side of the body and a surface mount contact portion provided at the bottom of the body. The body is configured to be aligned with a connector aperture formed through a printed circuit board with the aid of the alignment nub to provide a through-board PCB edge connector.

Preferably, the body is a first body and the PCB edge connector further includes a second body made from an electrically insulating material which was also configured to be aligned with the connector aperture. Preferably, the first body is separated from the second body by a distance as appropriate, to achieve the desired space, to receive a male edge connector with plug-in board.

A printed circuit board with integral edge connector in accordance with the present invention includes a printed circuit board having a top surface and a bottom surface, an aperture formed through the printed circuit board from the top surface to the bottom surface to provide at least two edges which at least partially form a perimeter of the aperture, and a connector aligned with at least one of the edges. A PC board male edge connector can be inserted through the aperture of the printed circuit board and engage the connector to electrically couple the circuitry of a plug-in board to the circuitry of a mother board. Preferably, the aperture is rectangular and has two major edges and two minor edges, where the connector is aligned with a first one of the major edges. Also preferably, the connector is a first connector and a second connector is aligned with a second one of the major edges of the aperture. By controlling the separation between the first connector and the second connector PCBs of different thicknesses can be accommodated.

When the top surface of the PC board is provided with a first plurality of differential traces, and the bottom surface is provided with a second plurality of differential traces, the top surface can support the functionality of a first electronic circuit and the bottom surface can support the functionality of a second electronic circuit in such a fashion that no vias or through-holes are required through the printed circuit board to support the functionality of the first electronic circuit and the second electronic circuit.

An electronic system in accordance with the present invention includes a plug-in board having a male edge connector, a mother board having a top surface and an opposing bottom surface, and provided with an aperture formed therethrough to provide at least two edges which at least partially form a perimeter for the aperture. A female connector is aligned with at least one of the edges, whereby the male edge connector of the plug-in board can be inserted through the aperture of the mother board and engage the female connector. Preferably, the mother board is provided with a pair of alignment holes extending at least partially through the mother board and the female connector is provided with a pair of alignment pins adapted to engage the alignment holes to align the female connector with the aperture.

A method for making a printed circuit board with integral edge connector includes forming an aperture through a printed circuit board from a top surface to a bottom surface and aligning a female edge connector with the aperture whereby a PCB male edge connector can be inserted through the aperture of the printed circuit board to engage with the female edge connector. Preferably, the method also includes forming a pair of alignment holes through the printed circuit board near to the aperture to aid in the alignment of the female edge connector with the aperture.

Even more preferably, the female edge connector comes in two parts, i.e., a first female edge connector and a second female edge connector such that two opposing side of the plug-in boards male edge connector can be contacted simultaneously when it is inserted into the aperture. The first and second female edge connectors can be both electrically coupled to the same side of the mother board, or to opposite sides of the mother board.

A method for connecting a plug-in board with a mother board in accordance with the present invention includes providing a mother board with an aperture and a female edge connector aligned with the aperture, providing a plug-in board with a male edge connector configured to extend through the aperture, and inserting the male edge connector through the aperture such that it engages the female edge connector.

As will be apparent from the preceding descriptions, the through-board PCB edge connector, system, and method provide a number of distinct advantages over the prior art. For one, the ground planes of the plug-in board and the mother board can be separated by a very small distance, e.g. a few thousandths of an inch, which improves high-frequency performance of the system in a dramatic fashion. Furthermore, the connector system is relatively inexpensive in comparison to connection systems of the prior art. So further, the current connection system is much more flexible in design than the prior art, and can be used to accommodate plug-in boards of various sizes, configurations, and thicknesses.

These and other advantages of the present invention will become apparent to those skilled in the art upon a reading of the following detailed descriptions and a study of the various figures of the drawing.

DETAILED DESCRIPTION OF THE PREFERRED EMBODIMENTS

Figure 4:
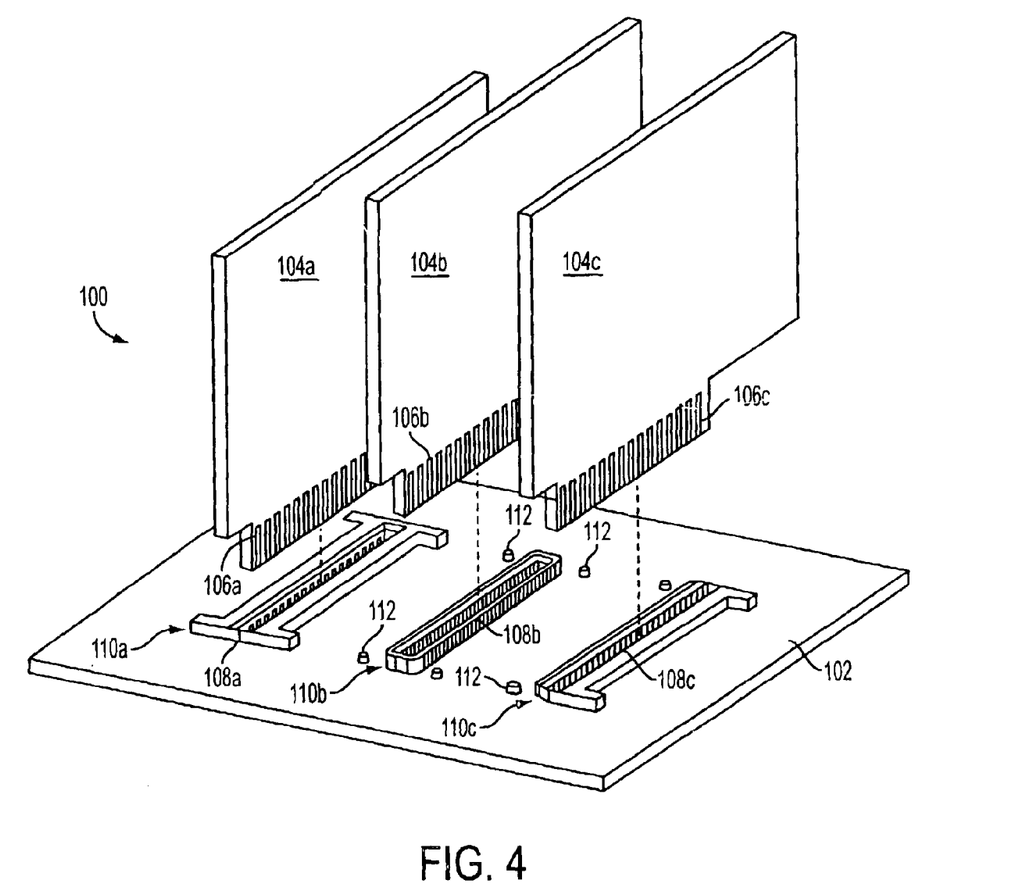
FIG. 4 is a perspective view illustrating a through-board PCB edge connector, system, and method in accordance with the present invention.

FIGS. 1, 2, and 3 were discussed in reference to the prior art. In FIG. 4, an exploded, perspective view of a through-board PCB edge connector system 100 is illustrated. The system 100 includes a mother board 102 and one or more plug-in boards 104a, 104b, and 104c. Plug-in boards 104a–104c are sometimes referred to as "daughter boards." Each of the plug-in boards 104a, 104b, and 104c include a male edge connector portion 106a, 106b, and 106c, respectively, which, as will appreciated by those skilled in the art, is simply an extension of the respective plug-in board. These male edge connectors 106a–106c are adapted to engage the slots 108a, 108b, and 108c, respectively, of female edge connectors 110a, 110b, and 110c, respectively, in accordance with the present invention. As will be discussed in greater detail subsequently, the female edge connectors 110a–110c can vary in configuration in accordance with a preferred split-connector design of the present invention. The female edge connectors 110a–110c are preferably aligned with apertures formed through the mother board 102 by alignment pins 112 which extend through holes drilled through the mother board 102. When the male edge connectors 106a–106c are operationally engaged with the female edge connectors 110a–110c, electronic circuitry on plug-in boards 104a–104c can be electrically connected to electronic circuitry on mother board 102. The design and manufacture of plug-in boards such as plug-in boards 104a–104c are well known to those skilled in the art and will not be discussed herein in any detail. Likewise, the basic construction and manufacturing of mother boards, such as mother board 102, is well known to those skilled in the art, and the modification of the mother board 102 to accommodate the female edge connectors 110a–110c will become apparent to those skilled in the art upon a reading of the following detailed descriptions and a study of the drawings.

Figure 5:
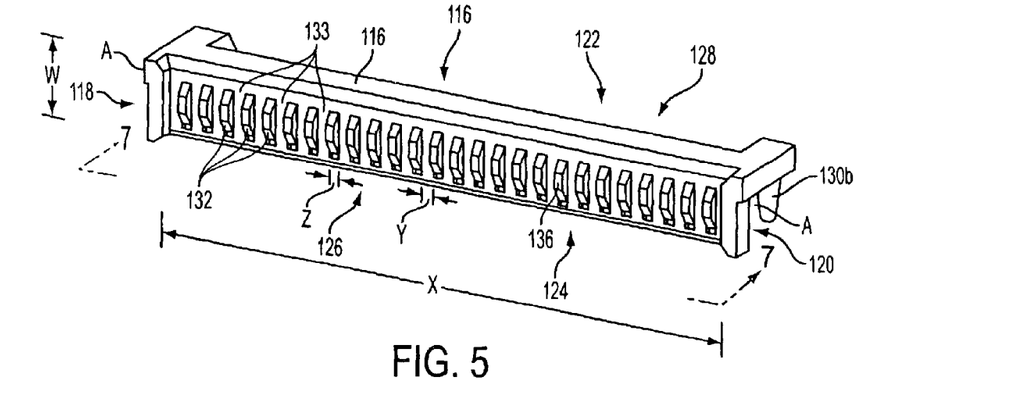
FIGS. 5 and 6 are perspective views of a female edge connector in accordance with the present invention as seen from opposing sides.

In FIG. 5, a unitary female edge connector 114 is illustrated in a perspective drawing. This female connector 114 is also shown in a perspective view in FIG. 6 after it has been rotated 180 degrees around a central axis A. The female edge connector 114 is, in the currently described referred embodiment, one component of the female card edge connectors 110a–110c illustrated in FIG. 4. However, as will be discussed in greater detail subsequently, the connector 114 can also be used on its own. Therefore, as used herein, a "female connector" shall refer to a single connector, such as connector 114, or a collection (i.e., two or more) of the connectors, such as connector 114.

Figure 6:
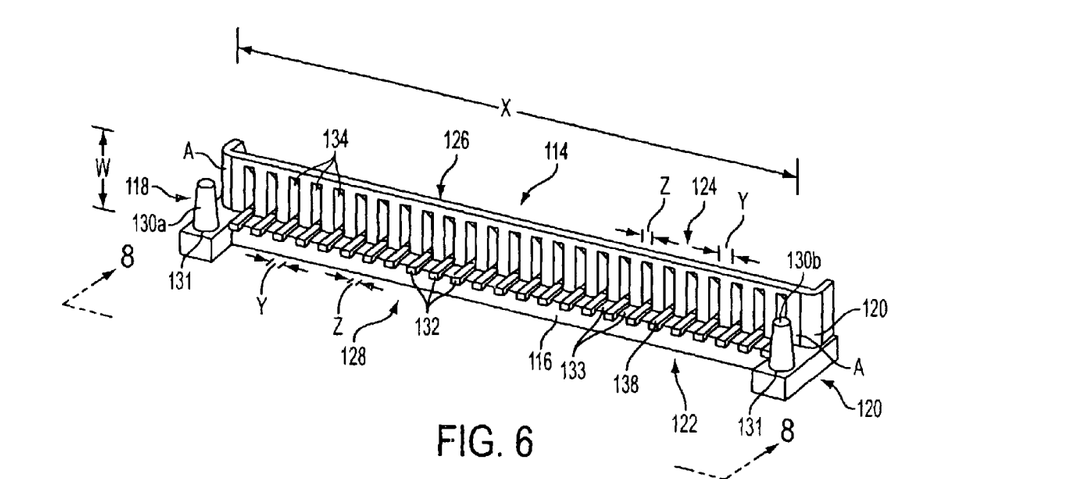

With reference to both FIGS. 5 and 6, female edge connector 114 includes an elongated body 116 made from an electrically insulating material, such as a polyvinylcloride (PVC) plastic material. Other insulating or "dielectric" materials suitable for elongated body will be well known to those skilled in the art. The elongated body 116 has a first end 118, a second end 120, a top 122, a bottom 124, an inner side 126, and an outer side 128. The elongated body 116 is further preferably provided with a pair of alignment pins or "nubs" 130a and 130b. The alignment pins and their operation will be discussed in greater detail subsequently.

The female edge connector 114 also includes a number of spaced contacts 132. As can be best seen in FIG. 6, these contacts engage aperture 134 of the body 116 a[ ]and are carried by body 116. Each of the contacts 132 are made from an electrically conducting material has preferably a "springy" metal such phosphor bronze. Other suitable materials will be apparent to those skilled in the art. The electrically conducting material can be plated with one or more other materials, as also will be appreciated by those skilled in the art.

Preferably each contact includes a spring contact portion 136 provided at the inner side 126 of the body 114 and a surface mount contact portion 138 provided at the bottom 124 of the body 114. While the contacts 132 are currently described as being made from a single piece of electrically conducting material, they can also be formed by two or more pieces that are electrically coupled together, as will be appreciated by those skilled in the art. Preferably, the spring portion 136 is plated with, for example, nickel or gold, and the surface mount contact portion 138 is plated with Sn/Pb plating to aid in the soldering process. Additional drawings of the female edge connector of FIGS. 5 and 6 can be seen in FIG. 7 which is an elevational view of the outer side of the female edge connector and FIG. 8 which is an inner side elevational view of the female edge connector.

Figure 7:
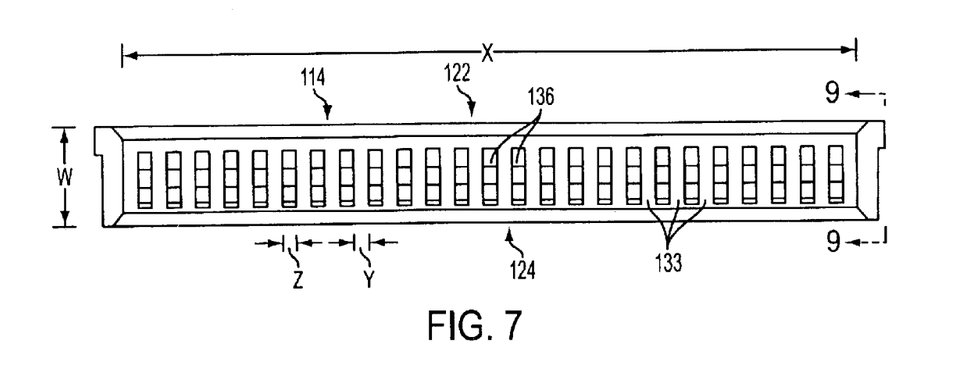
FIG. 7 is an elevational view of the outer side of the female edge connector illustrated in FIGS. 5 and 6.
Figure 8:
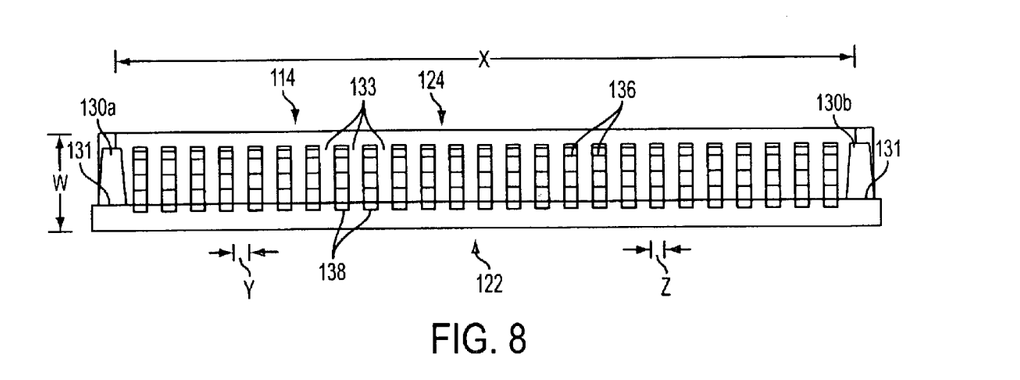
FIG. 8 is an inner side elevational view of the female edge connector of FIGS. 5 and 6.

Some typical dimensions of the female edge connector 114 include a diameter of the base 131 of nubs 130a and 130b, which is approximately 40 mils. Width of contacts 132 as depicted by distance Z is approximately 25 mils and a spacing 133 between the contacts 132 is approximately 50 mils, as defined by distance Y. The female edge connector 114 is also approximately 1,370 mils long between each end contact as defined by distance X. Distance X is can obviously vary as it is a function of the number of contacts 132 present on a female edge connector 114. Finally, distance W is approximately 175 mils and defines a height of the female edge connector 114. It should be re-emphasized that these are sample dimensions and a female edge connector 114 of varying dimensions can be constructed and still fall within the scope of the present invention.

Figure 9:
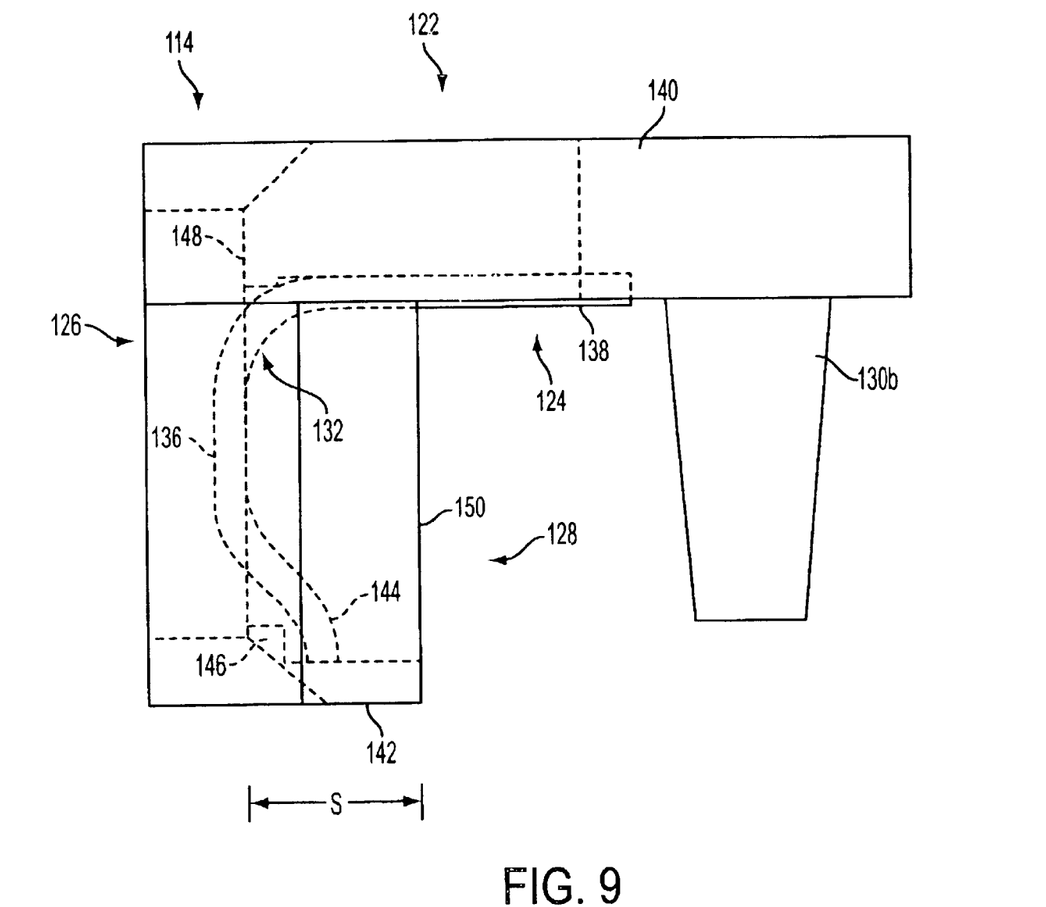
FIG. 9 is an end-view of the female edge connector of FIG. 8, the left and elevational view being a mirror image thereof.

FIG. 9 is an end view taken along line 9—9 of FIG. 7 which has been increased in size to provide additional detail. Overall, the body in cross section is L-shaped with a top portion 140 and a downwardly extending leg 142. The alignment pins, such as alignment pin 130b, also extend downwardly from the top portion 140. As described previously, the contacts 132 are provided within slots or apertures 134 in the body 122 and have a spring contact portion 136 and a surface mount contact portion 138. As can be seen in this view, the contact 132 is substantially J-shaped. That is, the spring-contact portion 136 is a curved portion of the overall shape, and the surface mount contact 138 is a straight portion of the overall J-shape. An end portion 144 near to the spring contact portion 136 is bent to engage a stop 146 to help anchor the contact in place. The distance S between the inner surface 148 of inner side 126 and the outer surface 150 of leg portion 142 shall be referred to as the "spring beam" distance, which is the limiting distance between the ground plane of a mother board to which the connector 114 is attached and a plug-in board having a male connector engaged with the contact 132. An example distance S is approximately 15 mils.

There are a number of ways that the connector 114 can be manufactured, as will be appreciated by those skilled in the art. One preferred method is by injection molding, but other standard methodologies can be used as well. Further, while it is preferred that the body 116 be of unitary construction, it can be also fabricated in separate pieces and joined in a suitable fashion. Likewise the contacts 132 are preferably formed in a unitary fashion but can also be made from separate pieces that are electrically coupled together.

Figure 10:
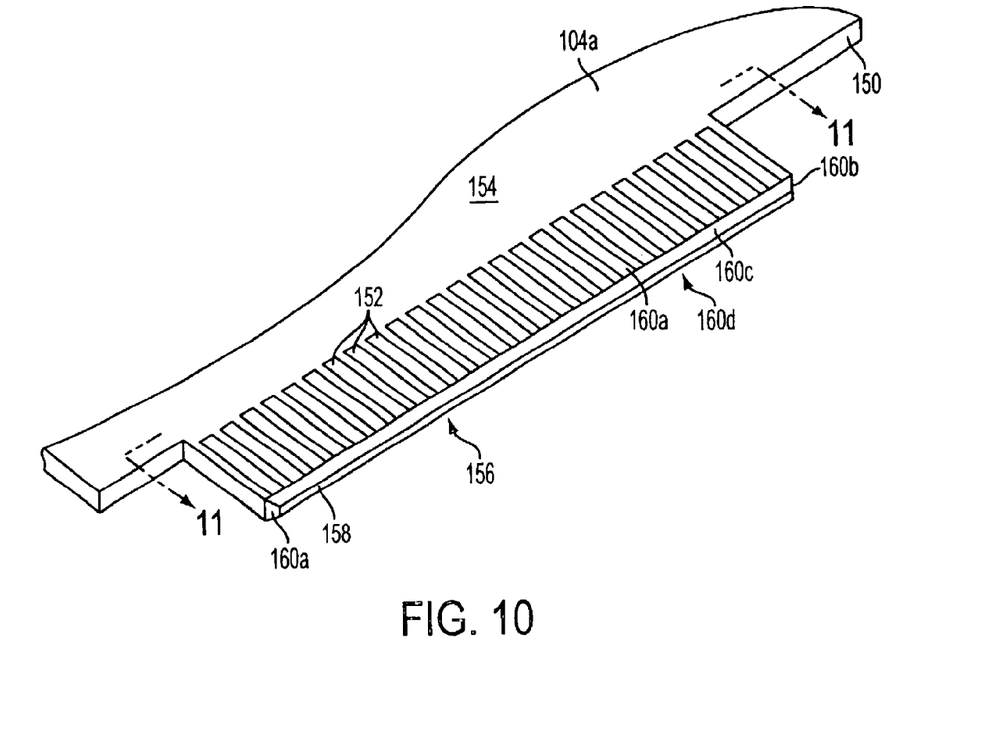
FIG. 10 is a broken-perspective view of a male edge connector used with the present invention.
Figure 11:
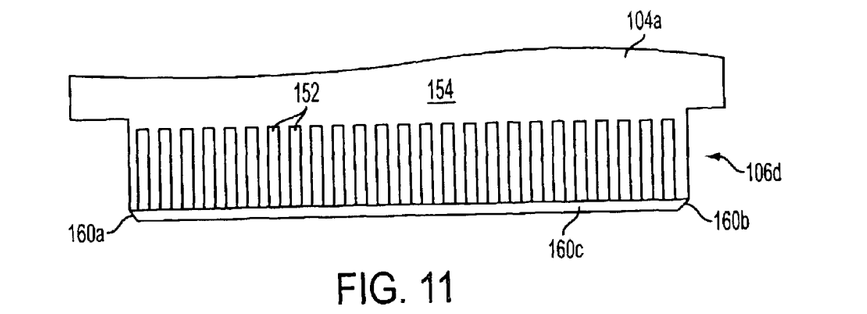
FIG. 11 is a top plan view of the male edge connector of FIG. 10.

FIG. 10 is a broken, perspective view of the male card edge connector 106a of plug-in board 104a of FIG. 4. FIG. 11 is a top plan view of the connector taken along lines 11—11 of FIG. 10. As mentioned previously, the manufacture and use of male card edge connectors is well known to those skilled in the art. Connector 106a is a protrusion from the edge 150 of plug-in board 106a and includes a number of traces 152. These traces are typically made from copper although they may be coated with a conductive material such as gold. If traces 152 can be considered to be on the "top" surface of the plug-in board 104a, then similar traces (not shown) can also be provided on the bottom surface 156 of the plug-in board 104a. The end 158 of the male connector 106a is chamfered to aid in its insertion into the slot of the female connector. This chamfering or beveling is preferably inwardly from all four edges of the end 156 such that the engagements with one or more of the edges with the slot of female connector will urge the male connector 106a towards the center of the slot. That is, there are two end bevels 160a and 160b, a top bevel 160c, and a bottom bevel 160d. The mother board 104a is of traditional PC board design and manufacture.

Figure 12:
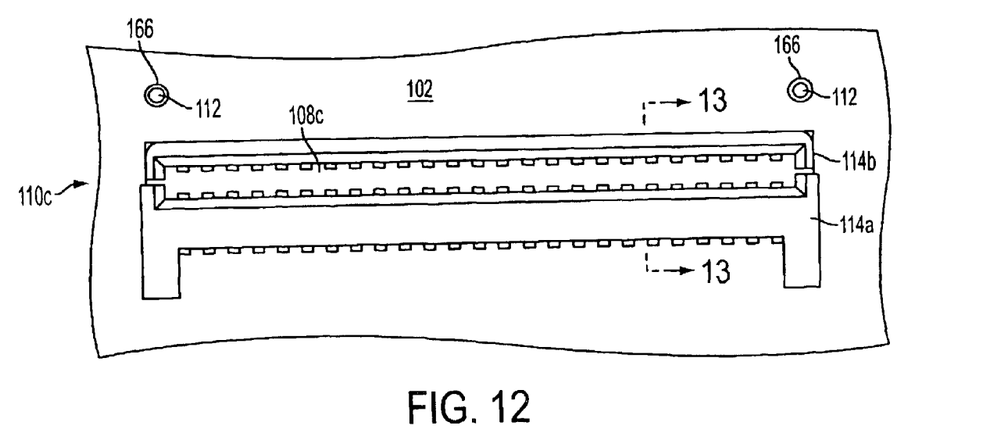
FIG. 12 illustrates a female edge connector in accordance with present invention attached to a mother board in a first configuration.
Figure 13:
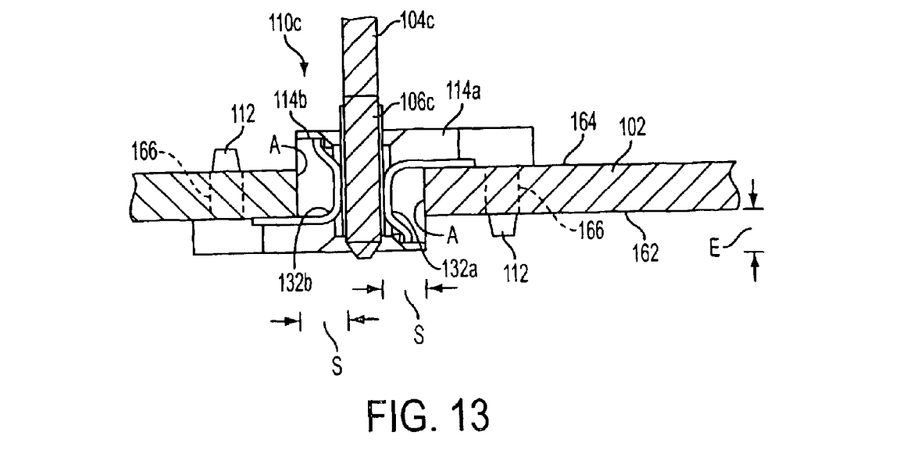
FIG. 13 is a cross-sectional view taken along line 13—13 of FIG. 12.

FIG. 12 is a top plan view of the female connector configuration 110c of FIG. 4. It will be noted that this configuration is created by using a pair of female edge connectors 114, labeled here 114a and 114b. FIG. 13 is a cross-sectional view taken along line 13—13 of FIG. 12 with the male edge connector 106c as can be seen in this figure. The connector 114b is inserted into an aperture A in the PC board 102 from a bottom surface 162, and the female edge connector 114a is inserted into the aperture A from a top surface 164. The alignment pins 112 of the connectors 114a and 114b are engaged with holes 166 drilled through the mother board 102. The alignment pins help to properly position and orient the female connectors 114a and 114b with the aperture to provide a slot 108c of the proper width for the male edge connector 106c.

It should be specifically noted that this two piece or "split" two-sided connector design can accommodate plug-in boards of various thicknesses. The slot 108c can, for example, be widened by forming a larger aperture A and by properly locating the holes 166 for the alignment pins 112. While it is preferred to use alignment pins and holes for this alignment process because of the great accuracy that can be achieved in the location of drill holes, it should be noted that the pin or "nub" can have a number of different equivalents. For example, the nub could engage with a surface mounted stop or alignment rather than a through-hole. Alternatively, the connector itself could be used for alignment with one or more of the edges of the aperture A. It should be noted that the connectors 114a and 114b are preferably surface-mounted components. These components can be coupled to traces or contacts or pads on the printed circuit board by techniques well known to those skilled in the art. For example, a stainless steel stencil can be used to put down a paste on the pads on the printed circuit boards at the right locations and then the stencil is removed and the components are installed. The paste is a combination of solder and flux. When exposed to higher temperatures in a "IR" reflow process, the solder melts and the flux causes the components to be drawn into place. Thus, once the connectors 114a and 114b are soldered to the mother board 102, these components are rigidly held in place. While the pins 112 may provide additional mechanical support as the male edge connector 106c is inserted into the female connector 110c, they are not technically required once the components have been soldered to the mother board 102.

With additional reference to FIG. 13, a male edge connector 106c seemed to be operationally engaged with the female edge connector 110c. As can be seen, the contact 132b of connector 114b couples traces from one side of male connector 106c to traces on the bottom of the mother board 102, while the contact 132a electrically couples traces from the other side of the male contact 106c to the top surface 164 of the mother board 102. It should be also noted that the spring beam length S is the distance between the ground planes on the mother board 102 and on the plug-in board 104c which can be as small as a few millimeters. It should also be noted that the male connector 106c extends entirely through the mother board 102 such that an end portion of the male connector 106c extends a distance E beyond the bottom surface 162 of the mother board 102. An example distance E is approximately 62 mils and depends on how far end portion 106c goes beyond the bottom surface 162 of the mother board 102.

Figure 14:
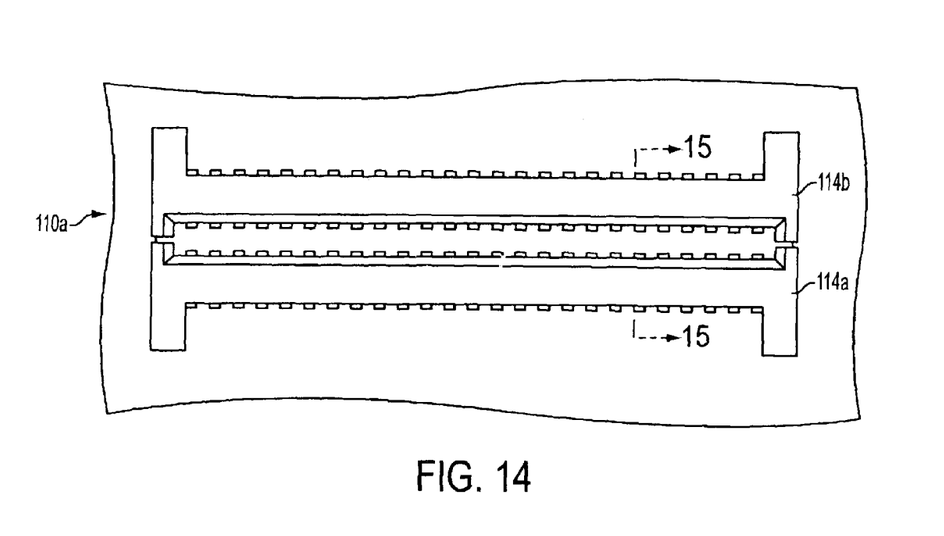
FIG. 14 is a top plan view of a female edge connector configuration attached to a mother board in accordance with the present invention.
Figure 15:
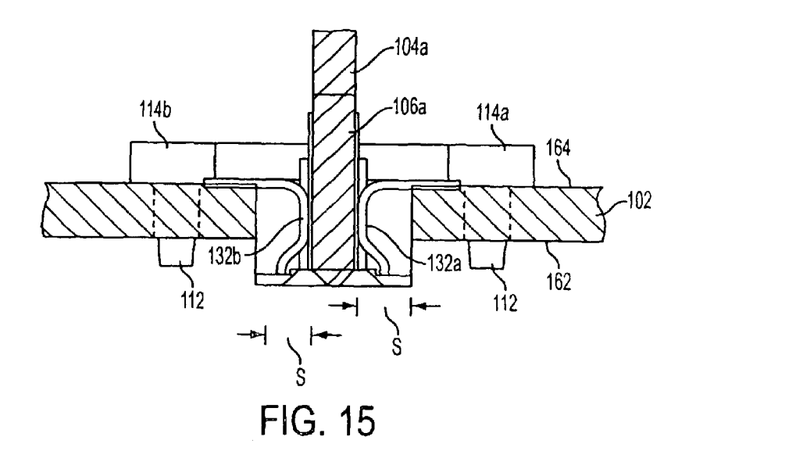
FIG. 15 is a cross-sectional view taken along line 15—15 of FIG. 14.

FIG. 14 is a top plan view of the connectors in accordance with the present invention configured as female connector 110a of FIG. 4. The description of FIG. 14 in the cross-section 15—15 as shown in FIG. 15 is very similar to the description made previously-with respective FIGS. 12 and 13. In the embodiments of FIGS. 14 and 15, however, all of the contacts 132b of connector 114b are in contact with traces on the top surface 164 of mother board 102 as well as all of the contacts 132a of connector 114a. In other words, the connector 114b has been flipped over from the bottom side 162 to the top side 164 of the mother board 102 such that all of the traces from both sides of the male connector 106a are electrically coupled to traces on the top surface 164 of PC board 102. The bottom surface 162 can therefore be a solid ground plane, if desired, which is separated from a ground plane of the plug-in board 104a by only the spring beam distance S.

Figure 16:
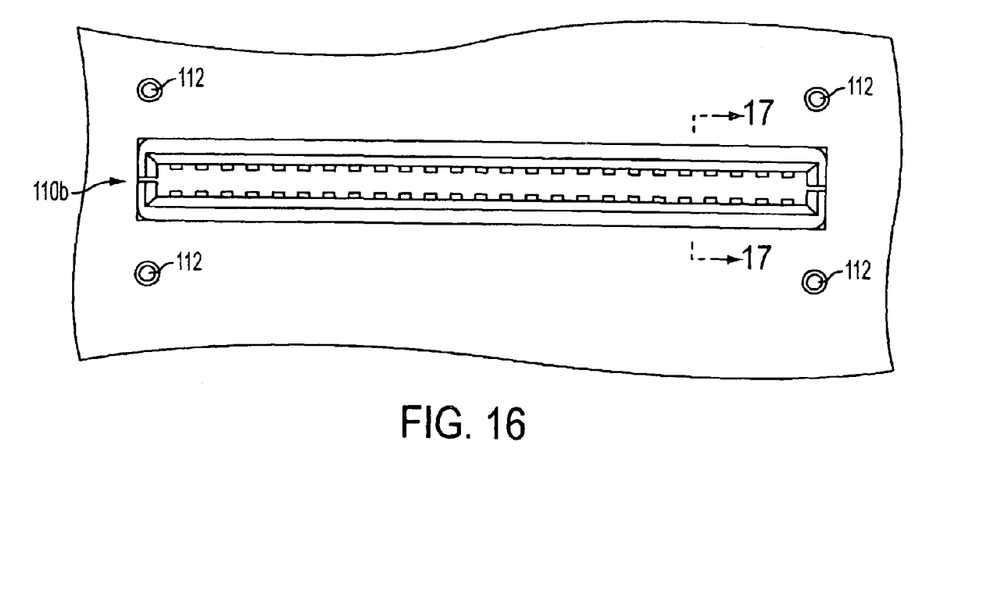
FIG. 16 is a top plan view of a female edge connector in a third operational configuration in accordance with the present invention.
Figure 17:
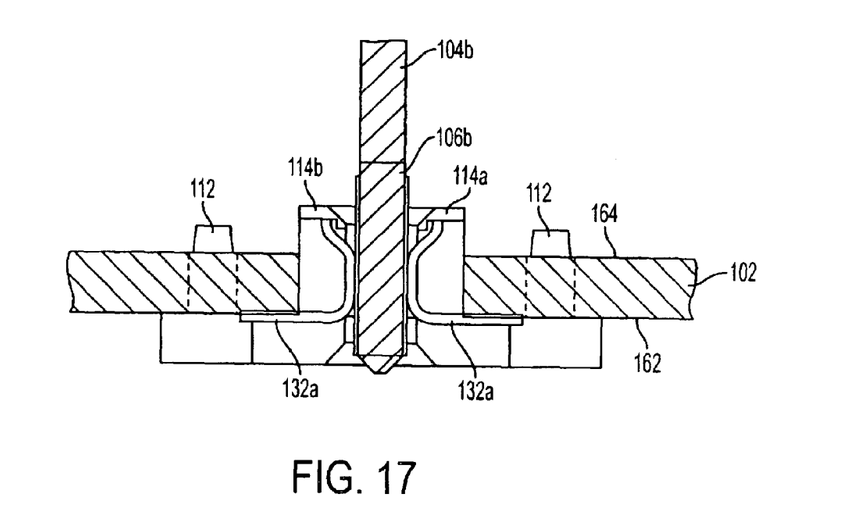
FIG. 17 is a cross-sectional view taken along line 17—17 of FIG. 16.

FIG. 16 is a top plan view of a female edge connector 110b of FIG. 4 in a third operational configuration in accordance with the present invention. The description of FIG. 16 in the cross section 17—17 as shown in FIG. 17 is similar to the description made previously with respective FIGS. 14 and 15. In the embodiments of FIGS. 14 and 15, however, all of the contacts 132a of connector s 114a and 114b are in contact with traces on the bottom surface 162 of mother board 102. In other words, both connectors 114a and 114b have been flipped over from the top side 164 to the bottom side 162 of the mother board 102 such that all of the traces from both sides of the male connector 106b are electrically coupled to traces on the bottom-surface 162 of PC board 102.

Figure 18:
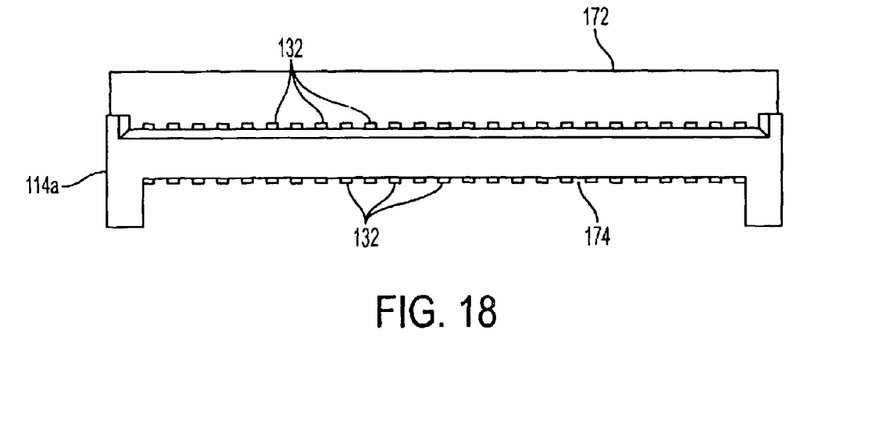
FIG. 18 is an inner side elevational view of an alternate embodiment for a female edge connector in accordance with the present invention.
Figure 19:
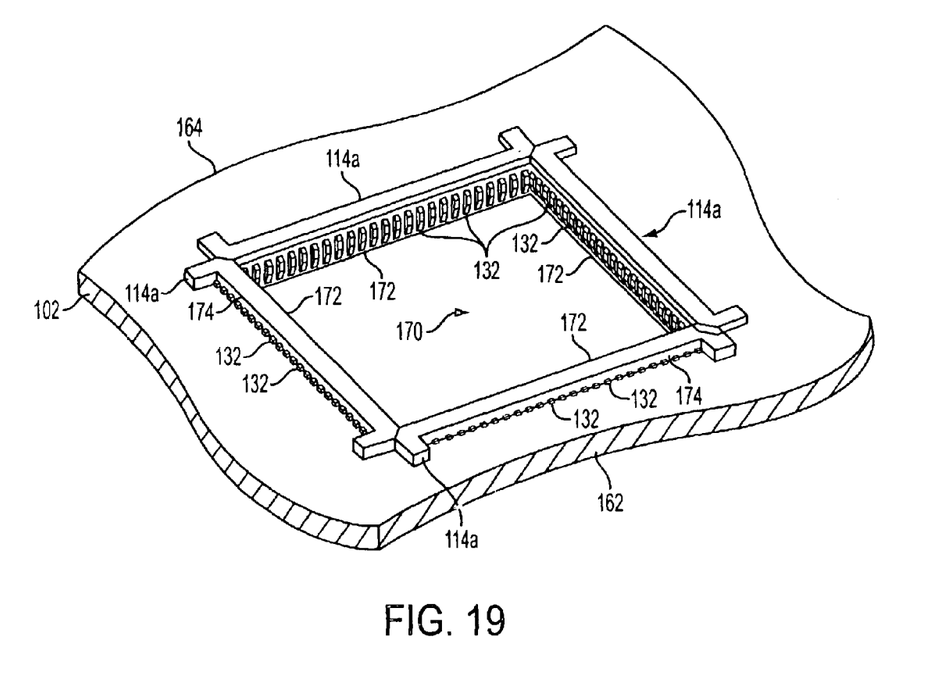
FIG. 19 is a perspective view of four of the female connectors illustrated in FIG. 18 engaged with an aperture of a PCB.
Figure 20:
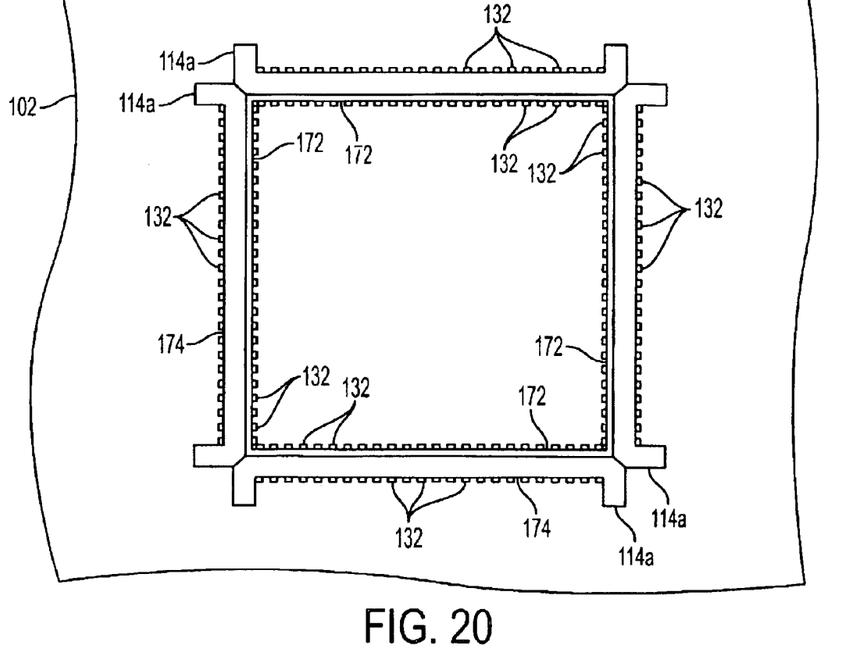
FIG. 20 is a top plan view of the female edge connector illustrated in FIG. 19.

FIG. 18 is an inner side elevational view of an alternate embodiment for a female edge connector 114a in accordance with the present invention. Also included are contacts 132, as previously described in FIGS. 5 and 6, as well as inner side surface 172 and outer side surface 174. FIG. 19 is a perspective view of four of the female connectors 114a illustrated in FIG. 18 engaged with an aperture 170 of a PCB 102. As can be seen, the four female connectors 114a are disposed such that each inner side surface 172 is exposed. In this configuration, the set of female edge connectors 114a are receptive to an analogously shaped male edge connector (not shown). FIG. 20 is a top plan view of the female edge connector 114a engaged in an aperture 170 of a PCB 101, as illustrated in FIG. 19. Advantageously, this embodiment offers circuit board/connector design flexibility since one does not necessarily need to be constrained in one particular direction when adding contacts 132. It will be appreciated by one skilled in the art that the four female edge connector embodiment could also employ a pair of parallel female edge connectors of a length different from the other pair of parallel female edge connectors, e.g. a rectangle.

Figure 21:
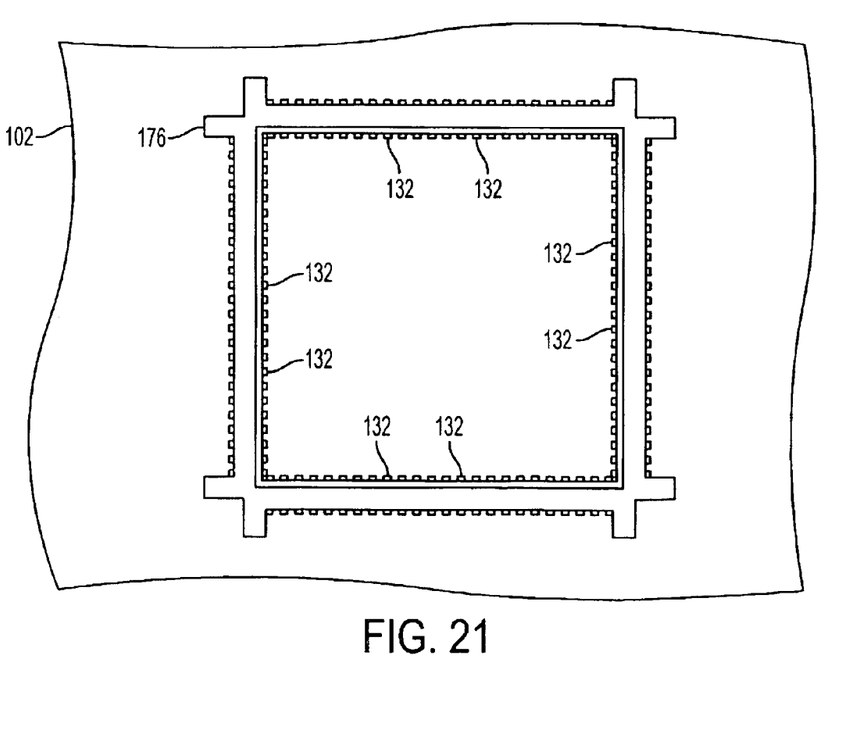
FIG. 21 is a top plan view similar to the top plan view of FIG. 20 except that the female edge connector is made from a unitary body rather than in four sections.

FIG. 21 shows a top plan view similar to the top plan view of FIG. 20 of a variation of the four female edge connector embodiment wherein the female edge connector 176 is made from a unitary body rather than in four sections. Some possible uses for the four female edge connector embodiment includes, but is not limited to, high-frequency and special microwave installations.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

What is claimed is:

1. A through-board PCB edge connector comprising:
   a first elongated body made from an electrically insulating material and having a first end, a second end, a top, a bottom, an inner side, and an outer side, said first elongated body being provided with a first PC board alignment pin;
   a first plurality of spaced contacts carried by said first elongated body and made from an electrically conducting material, wherein each contact includes a spring contact portion provided at said inner side of said first elongated body and a surface mount contact portion provided at said bottom of said first elongated body;
   a second discrete elongated body made from said electrically insulating material and having a first end, a second end, a top, a bottom, a inner side, and a outer side, said second elongated bode being provided with a second PC board alignment pin;
   a second plurality of spaced contacts carried by said second elongated body and made from said electrically conducting material, wherein each contact includes a spring contact portion provided at said inner side of said second elongated body and a surface mount contact portion provided at said top of said second elongated body;
   whereby said first elongated body is configured to be associated with a first edge of a connector aperture formed through a printed circuit board with the aid of said first alignment pin and whereby said second elongated body is configured to be associated with a second edge of the connector aperture with the aid of said second alignment pin to provide a through-board PCB edge connector.

2. A through-board PCB edge connector as recited in claim 1 wherein said first elongated body and said second elongated body separate unitary bodies.

3. A through board PCB edge connector as recited in claim 2 wherein said first elongated body is provided with a first plurality of alignment pins configured to engage said printed circuit board and said second elongated body is provided with a second plurality of alignment pins to enrage said printed circuit board.

4. A through-board PCB edge connector as recited in claim 3 wherein said first plurality of spaced contacts are each made from a first unitary piece of a spring metal alloy and said second plurality of spaced contacts are each made from a second unitary piece of spring metal alloy.

5. A through-board PCB edge connector as recited in claim 4 wherein each of said first and second plurality of spaced contacts is substantially J shaped.

6. A through-board PCB edge connector as recited in claim 2 wherein said first elongated body is in contact with said second elongated body.

7. A through-board PCB edge connector as recited in claim 1 wherein said first elongated body is integral with said second elongated body.

8. A printed circuit board with integral edge connector comprising:
   a printed circuit board having a top surface and an opposing bottom surface;
   an aperture formed through said printed circuit board from said top surface to said bottom surface to provide at least two edges which at least partially form a perimeter for said aperture, wherein said aperture has two substantially parallel major edges; and
   a first connector associated with a first one of said two major edges, whereby a PCB edge connector can be inserted through said aperture of said printed circuit board and engage said connector, and wherein a second discrete connector is associated with a second one of said two major edges, and wherein said first connector is separated from said second connector.

9. A printed circuit board with integral edge connector as recited in claim 8 wherein said first connector contacts said second connector.

10. A printed circuit board with integral edge connector as recited in claim 8 wherein said first connector is integral with said second connector.

11. A printed circuit board with integral edge connector as recited in claim 8 wherein said printed circuit board is provided with an alignment hole extending at least partially through said printed circuit board, and at least one of said first connector and said second connector is provided with an alignment pin adapted to engage said alignment hole to associate said at least one connector with a major edge of said aperture.

12. A printed circuit board with integral edge connector as recited in claim 8 wherein said top surface of said printed circuit board is provided with a plurality of differential traces, and wherein said printed circuit board further includes a ground plane to provide a loosely coupled differential pairs with said plurality of differential traces.

13. A printed circuit board with integral edge connector as recited in claim 12 wherein said ground plane is provided by said bottom surface.

14. A printed circuit board with integral edge connector as recited in claim 8 wherein said top surface is provided with a first plurality of differential traces, and said bottom surface is provided with a second plurality of differential traces, such that said top surface can support the functionality of a first electronic circuit and said bottom surface can support the functionality of a second electronic circuit in such a fashion that no vias are required through said printed circuit board to support the functionality of said first electronic circuit and said second electronic circuit.

15. An electronic system comprising:
   a plug-in board having a male edge connector;
   a mother board having a top surface and an opposing bottom surface;
   an aperture formed through said mother board from said top surface to said bottom surface to provide at least two edges which-at least partially form a perimeter for said aperture;

a first female connector associated with at least one of said edges, whereby said male edge connector of said plug-in board can be inserted through said aperture of said mother board and engage said first female connector, wherein said aperture has two major edges and two minor edges, and wherein said first female connector is associated with a first one of said major edges; and a second discrete female connector associated with a second one of said major edges of said aperture, whereby said male connector of said plug-in board can be inserted through said aperture of said mother board and engage said second female connector.

16. An electronic system as recited in claim 15 wherein said aperture is rectangular.

17. An electronic system as recited in claim 15 wherein said first female connector is separated from said second female connector.

18. An electronic system as recited in claim 15 wherein said first female connector contacts said second female connector.

19. An electronic system as recited in claim 18 wherein said first female connector is integral with said second connector female.

20. An electronic system as recited in claim 15 wherein said mother board is provided with an alignment hole extending at least partially through said mother board, and at least one of said first female connector and said second female connector is provided with an alignment pin adapted to engage said alignment hole to associate said at least one female connector with said aperture.

21. An electronic system as recited in claim 15 wherein said top surface of said mother board is provided with a plurality of differential traces, and wherein said mother board further includes a ground plane to provide a loosely coupled differential pairs with said plurality of differential traces.

22. An electronic system as recited in claim 21 wherein said ground plane is provided by said bottom surface.

23. An electronic system as recited in claim 15 wherein said top surface is provided with a first plurality of differential traces, and said bottom surface is provided with a second plurality of differential traces, such that said top surface can support the functionality of a first electronic circuit and said bottom surface can support the functionality of a second electronic circuit.

24. A method for making a printed circuit board with integral edge connector comprising:

forming an aperture through a printed circuit board from a top surface to a bottom surface thereof, whereby at least two edges which at least partially form a perimeter for said aperture are provided;

forming an alignment hole through said printed circuit board proximate to said aperture to aid in the alignment of a first female edge connector with said aperture;

engaging said first female edge connector with said alignment hole;

soldering said first female edge connector to said printed circuit board;

associating a second discrete female edge connector with said aperture wherein one of said first female connector and said second female connector is in electrical contact with said top surface of said printed circuit board and the other of said first female connector and said second female connector is in electrical contact with said bottom surface of said printed circuit board.

25. A method for connecting a plug-in board with a mother board comprising:

providing a mother board with an aperture and a first female edge connector and a second discrete female connector associated with said aperture;

inserting a male edge connector of a plug-in board through said aperture such that it simultaneously engages with said first female edge connector and said second female connector.

* * * * *